United States Patent
Ghandi et al.

(10) Patent No.: US 9,704,949 B1
(45) Date of Patent: Jul. 11, 2017

(54) ACTIVE AREA DESIGNS FOR CHARGE-BALANCED DIODES

(71) Applicant: General Electric Company, Schenectady, NY (US)

(72) Inventors: Reza Ghandi, Niskayuna, NY (US); Peter Almern Losee, Clifton Park, NY (US); Alexander Viktorovich Bolotnikov, Niskayuna, NY (US); David Alan Lilienfeld, Niskyuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/199,262

(22) Filed: Jun. 30, 2016

(51) Int. Cl.
| | |
|---|---|
| *H01L 29/16* | (2006.01) |
| *H01L 29/06* | (2006.01) |
| *H01L 29/872* | (2006.01) |
| *H01L 21/04* | (2006.01) |
| *H01L 29/66* | (2006.01) |

(52) U.S. Cl.
CPC ...... *H01L 29/0634* (2013.01); *H01L 21/0455* (2013.01); *H01L 29/1608* (2013.01); *H01L 29/6606* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 7,397,102 B2 | 7/2008 | Hshieh et al. | |
| 7,436,022 B2 | 10/2008 | Bhalla et al. | |
| 8,384,182 B2 | 2/2013 | Mazzola et al. | |
| 8,901,699 B2* | 12/2014 | Ryu | H01L 29/872 257/472 |
| 8,969,994 B2 | 3/2015 | Raj et al. | |
| 2009/0179297 A1 | 7/2009 | Stewart et al. | |
| 2009/0224354 A1 | 9/2009 | Konstantinov et al. | |
| 2011/0266558 A1* | 11/2011 | Yano | H01L 21/0485 257/77 |
| 2014/0203299 A1* | 7/2014 | Aketa | H01L 29/872 257/77 |

(Continued)

OTHER PUBLICATIONS

Zhu, Lin, et al.; "1.5kV Novel 4H-SiC Lateral Channel (LC) JBS Rectifiers with Low Leakage Current and Capacitance", Power Semiconductor Devices and ICs, 2005. Proceedings. ISPSD '05. The 17th International Symposium on, pp. 283-286, May 23-26, 2005, Santa Barbara, CA.

(Continued)

*Primary Examiner* — Alexander Ghyka

(74) *Attorney, Agent, or Firm* — Nitin N. Joshi

(57) ABSTRACT

A charge-balanced (CB) diode may include one or more CB layers. Each CB layer may include an epitaxial layer having a first conductivity type and a plurality of buried regions having a second conductivity type. Additionally, the CB diode may include an upper epitaxial layer having the first conductivity type that is disposed adjacent to an uppermost CB layer of the one or more CB layers. The upper epitaxial layer may also include a plurality of junction barrier (JBS) implanted regions having the second conductivity type. Further, the CB diode may include a Schottky contact disposed adjacent to the upper epitaxial layer and the plurality of JBS implanted regions.

21 Claims, 8 Drawing Sheets

(56) References Cited

U.S. PATENT DOCUMENTS

| | | | | |
|---|---|---|---|---|
| 2014/0291697 A1* | 10/2014 | Rupp | ................ | H01L 29/1608 257/77 |
| 2014/0363959 A1* | 12/2014 | Hong | .................... | H01L 29/36 438/518 |
| 2015/0206941 A1* | 7/2015 | Uehigashi | ............ | H01L 29/872 257/77 |
| 2016/0005884 A1* | 1/2016 | Aketa | ................ | H01L 29/6606 257/43 |
| 2016/0104779 A1* | 4/2016 | Rupp | ................ | H01L 29/1608 257/77 |
| 2016/0190126 A1* | 6/2016 | Bauer | .................... | H01L 29/36 257/476 |
| 2016/0380059 A1* | 12/2016 | Losee | ................ | H01L 29/1608 257/77 |

OTHER PUBLICATIONS

Heinze, Birk, et al.; "Surge Current Ruggedness of Silicon Carbide Schottky- and Merged-PiN-Schottky Diodes", Dower Semiconductor Devices and IC's, 2008. ISPSD '08. 20th International Symposium on, pp. 245-248, May 18-22, 2008, Orlando, FL.

Runhua, Huang, et al.; "Development of 10 kV 4H-SiC JBS diode with FGR termination", Journal of Semiconductors, vol. 35, Issue: 7, 2014.

* cited by examiner

US 9,704,949 B1

ACTIVE AREA DESIGNS FOR CHARGE-BALANCED DIODES

BACKGROUND

The subject matter disclosed herein relates to diodes and, more specifically, to active area designs for charge-balanced diodes.

For semiconductor power devices, charge-balanced (also referred to as super-junction) designs offer several advantages. For example, charge-balanced devices demonstrate reduced drift layer resistance and thus reduced conduction losses per unit area relative to traditional unipolar device designs. In silicon (Si) charge-balanced devices, an active area may be formed by implanting or diffusing a number of vertical pillars of a first dopant type (e.g., p-type) into a Si device layer of a second dopant type (e.g., n-type). The vertical pillars of these Si charge-balanced devices extend through the thickness (e.g., tens of micrometers) of the Si epitaxial device layer, which can be achieved using existing Si epitaxy, implantation and/or diffusion methods.

However, in silicon carbide (SiC), dopants have significantly lower diffusion coefficient/implantation range than in Si. As a result, when a feature (e.g., a vertical charge-balance region) is formed into a SiC epitaxial layer using an implantation energy that is typical of Si processing, the dopants are unable to penetrate into the SiC layer as deep as they would into the Si layer. For example, typical commercial ion implantation systems for Si device fabrication utilize dopant implantation energies up to about 380 keV. Such implantation energies only enable dopant implantation to a maximum depth between approximately 0.5 µm and approximately 1 µm into the surface of a SiC epitaxial layer.

BRIEF DESCRIPTION

In one embodiment, a charge-balanced (CB) diode includes an active area including one or more charge-balanced (CB) layers. Each CB layer includes an epitaxial layer having a first conductivity type. Additionally, each CB layer includes a plurality of buried regions having a second conductivity type implanted in the epitaxial layer. The plurality of buried regions and the epitaxial layer are both configured to substantially deplete to provide substantially equal amounts of charge from ionized dopants when a reverse bias is applied to the CB diode. Additionally, the active area includes an upper epitaxial layer having the first conductivity type. The upper epitaxial layer is disposed adjacent to an uppermost CB layer of the one or more CB layers. Additionally, the upper epitaxial layer includes a plurality of junction barrier Schottky (JBS) implanted regions having the second conductivity type. Further, the CB diode includes a Schottky contact disposed adjacent to the upper epitaxial layer to form a Schottky junction. The Schottky contact is formed from a low barrier height metal or a low barrier height polysilicon. Additionally, the Schottky contact is disposed adjacent to the plurality of JBS implanted regions.

In one embodiment, a charge-balanced (CB) diode includes one or more charge-balanced (CB) layers. Each CB layer includes an epitaxial layer having a first conductivity type. Additionally, each CB layer includes a plurality of buried regions having a second conductivity type implanted in the epitaxial layer. A thickness of each buried region of the plurality of buried regions is less than a thickness of the epitaxial layer. Additionally, the CB diode includes an upper epitaxial layer having the first conductivity type and disposed on top of the one or more CB layers. The upper epitaxial layer comprises a plurality of junction barrier Schottky (JBS) implanted regions having the second conductivity type, and a thickness of each JBS implanted region of the plurality of JBS implanted regions is less than a thickness of the upper epitaxial layer. Further, the CB diode includes a Schottky contact disposed on top of the upper epitaxial layer. The Schottky contact is disposed adjacent to the plurality of JBS implanted regions.

In one embodiment, a method of manufacturing a charge-balanced (CB) diode includes forming a first epitaxial layer having a first conductivity type on top of a substrate layer. Additionally, the method includes implanting a first plurality of buried regions having a second conductivity type into the first epitaxial layer to form a first charge balance (CB) layer. The method also includes forming a second epitaxial layer having the first conductivity type above to the first CB layer. Further, the method includes implanting a plurality of junction barrier Schottky (JBS) implanted regions having the second conductivity type into the second epitaxial layer. A sheet doping concentration of the plurality of JBS implanted regions is between approximately $1 \times 10^{13}$ cm$^{-2}$ and approximately $2 \times 10^{16}$ cm$^{-2}$. Additionally, the method includes depositing a Schottky contact on top of and adjacent to the second epitaxial layer and the plurality of JBS implanted regions.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
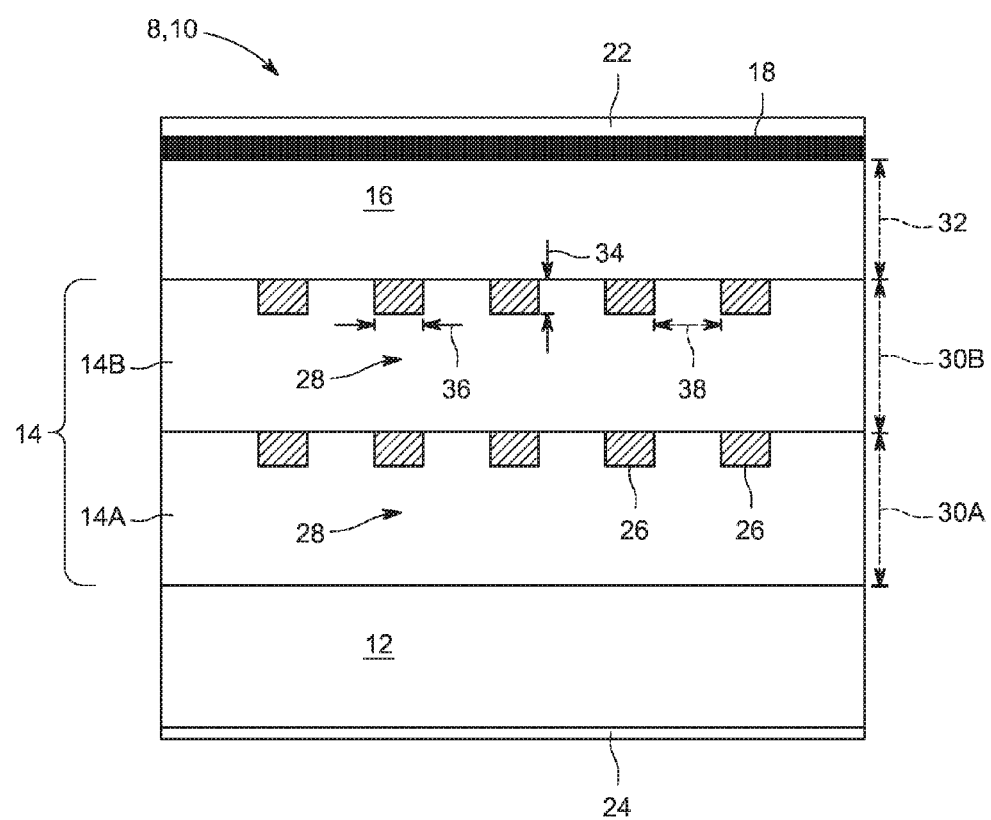
FIG. 1 is a schematic illustrating a cross-sectional view of the active area of a multi-layer charge-balanced (CB) diode having an upper epitaxial layer, a Schottky contact formed on the upper epitaxial layer, and CB layers that each include buried regions, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer. Further, as used herein, the term "multi-layered," as well as references to a particular number of layers (e.g., "two-layered," "three-layered," "four-layered," etc.), refers to the number of epitaxial layers of the device.

Present embodiments are directed toward designs and methods for manufacturing vertical semiconductor charge-balanced (CB) diodes, also referred to as semiconductor super-junction (SJ) diodes. The disclosed designs and methods are useful in the manufacture of CB diodes, such as CB Schottky diodes, CB junction barrier Schottky (JBS) diodes, merged PiN Schottky (MPS) diodes, as well as other diodes that may be useful for medium-voltage (e.g., 2 kV-10 kV) and high-voltage (e.g., greater than 10 kV) power conversion related applications. While the following discussion relates to silicon carbide (SiC) CB diodes, the disclosed designs and methods may be used with any suitable semiconductor materials, such as silicon (Si), gallium nitride, diamond, aluminum nitride, boron nitride, for example.

The disclosed multi-layered SiC CB designs and manufacturing techniques enable the production of SiC CB diodes, despite the aforementioned low diffusion coefficients of dopants in SiC compared to Si. In particular, as discussed below, the disclosed CB diode designs include multi-layered active cell structures implemented using repeated epitaxial growth and dopant implantation steps. The disclosed multi-layered SiC CB designs offer reduced on-resistance, conduction losses, and switching losses compared to existing SiC or Si diodes having the same current/voltage rating. Further, the disclosed multi-layered SiC CB designs enable operation at significantly higher current densities than conventional SiC high-voltage unipolar devices, and higher switching frequencies than conventional SiC high-voltage bipolar devices. The disclosed SiC CB diode designs are also generally robust to both n-type and p-type doping variability, which improves device yield and performance. Further, by having drift layers doped higher than allowed by the one-dimensional (1-D) limit of conventional designs, the disclosed SiC CB diodes enable lower on-resistance and lower conduction losses for a given breakdown voltage rating compared to conventional 1-D designs. Additionally, certain disclosed SiC CB diode embodiments may be manufactured using common semiconductor fabrication equipment, such as ion implantation systems used by existing Si/SiC device manufacturing, to provide additional cost benefits.

As discussed in detail below, the disclosed SiC CB active cell designs include buried regions (e.g., floating regions) of n-type or p-type doping (e.g., buried charge-balance regions or floating charge-balance regions) that reshape the electric field in the active area of a SiC CB diode. These regions are referred to herein as "buried" or "floating" in that the regions are disposed within lower epitaxial layers (i.e., epitaxial layers that are disposed between the substrate layer and the top or upper epitaxial layer) of the SiC CB device and are not in contact with a Schottky contact disposed adjacent to and on top of the upper epitaxial layer. Additionally, in some embodiments, the disclosed SiC CB active cell designs may include junction barrier Schottky (JBS) implanted regions of n-type or p-type doping that reshape the electric field in the active area of a SiC CB diode. These regions are referred to herein as "JBS implanted regions," "non-floating regions," or "non-buried regions" in that the regions are disposed within the upper epitaxial layer of the SiC CB device and are in contact with the Schottky contact. As discussed below, the JBS implanted regions reshape the electric field at the junction between the Schottky contact and the upper epitaxial layer to reduce the leakage current of the SiC CB diode. For the disclosed SiC CB diode embodiments, as discussed below, these designs utilizing discrete buried regions and/or JBS implanted regions enable low conduction losses, low on-state resistance, and high breakdown voltages while still maintaining a relatively simple fabrication process.

FIG. 1 is a schematic illustrating a cross-sectional view of the active area 8 of an embodiment of a SiC charge-balanced (CB) diode 10, also referred to as a SiC super-junction (SJ) diode. In some embodiments, the SiC CB diode 10 may be a Schottky diode. It may be appreciated that, in order to more clearly illustrate certain components of the SiC CB diode 10, as well as other SiC CB diodes discussed below, certain commonly understood design elements (e.g., top metallization, passivation, edge termination, and so forth) may be omitted.

The illustrated SiC CB device 10 includes a SiC substrate layer 12, two SiC charge-balanced (CB) layers 14 (e.g., 14A and 14B) disposed on the SiC substrate layer 12, and a top or upper SiC epitaxial layer 16 disposed on the SiC CB layers 14. In particular, the first SiC CB layer 14A is disposed above and adjacent to the SiC substrate layer 12, the second SiC CB layer 14B is disposed above and adjacent to the first SiC CB layer 14A, and the upper SiC epitaxial layer 16 is disposed above and adjacent to the second SiC CB layer 14B. The SiC substrate layer 12, the SiC CB layers 14, and the upper SiC epitaxial layer 16 each have a first conductivity type (e.g., n-type). As noted above, the disclosed designs may also be applied using other semiconductor materials, such as silicon, gallium nitride, diamond, aluminum nitride, boron nitride, for example. Accordingly, in some embodiments, the substrate layer 12, the CB layers 14, and/or the upper epitaxial layer 16 may be formed from SiC, silicon, gallium nitride, diamond, aluminum nitride, boron nitride, and/or any other suitable semiconductor material. Further, while the illustrated embodiment includes two SiC CB layers 14 (e.g., 14A and 14B), the SiC CB diode 10 may include any suitable number of SiC CB layers (e.g., 1, 3, 4, 5, 6, or more) to provide a device with the desired blocking capability.

Additionally, the illustrated SiC CB device 10 includes a Schottky contact 18 (e.g., a Schottky barrier) disposed above and adjacent to the upper SiC epitaxial layer 16. The Schottky contact 18 forms a Schottky barrier with the upper SiC epitaxial layer 16 at the junction of the upper SiC epitaxial layer 16 and the Schottky contact 18. Further, the SiC CB diode 10 includes a top contact 22, which is disposed on and adjacent to the Schottky contact 18, and a bottom contact 24, which is disposed below and adjacent to the SiC substrate 12.

In some embodiments, the Schottky contact 18 may be formed from a low Schottky barrier height material A Schottky barrier is a barrier for electrons formed at a metal-semiconductor junction. For n-type material, the Schottky barrier height is a difference, in electron volts (eV), between the Fermi energy level or work function of the metal and the conduction band energy level in the semiconductor (e.g., SiC) at the Schottky barrier. For p-type material, the barrier height is given by the difference between the valence band edge and the Fermi energy in the metal. A low Schottky barrier height may reduce the turn-on voltage and increase the current carrying capabilities of the SiC CB diode 10 relative to high Schottky barrier diodes. However, a low Schottky barrier may increase the leakage current of the SiC CB diode 10 relative to high Schottky barrier diodes. In some embodiments, the Schottky barrier height may be less than approximately 1 eV, approximately 0.9 eV, approximately 0.85 eV, or approximately 0.65 eV. In some embodiments, the Schottky contact 18 may be formed from a metal having low Fermi energy level, such as titanium (Ti), nickel (Ni), or cobalt (Co). In certain embodiments, the Schottky contact 18 may be formed from a metal silicide having low Fermi energy level, such as titanium silicide ($TiSi_2$), nickel silicide ($NiSi_2$), or cobalt silicide ($CoSi_2$). In some embodiments, the Schottky contact 18 may be formed from a polysilicon. For example, the Schottky contact 18 may be formed from a highly doped polysilicon having a dopant concentration of greater than approximately $1 \times 10^{17}$ $cm^{-3}$, approximately $1 \times 10^{18}$ $cm^{-3}$, or approximately $1 \times 10^{20}$ $cm^{-3}$. In some embodiments, the Schottky contact 18 may include a low doped polysilicon layer (e.g., having a dopant concentration less than approximately $1 \times 10^{17}$ $cm^{-3}$) and a metal layer, such as aluminum (Al), tungsten (W), Ni, Ti, Co, and so forth. In certain embodiments, the Schottky contact 18 may be formed from a material having high Fermi energy level, such as palladium (Pa) or platinum (Pt).

As illustrated, the first and second CB layers 14A and 14B each include a plurality of buried regions 26 (e.g., buried charge-balance regions or floating charge-balance regions) having a second conductivity type (e.g., p-type or n-type). Specifically, the buried regions 26 are oppositely doped relative to the remainder 28 of the SiC CB layers 14A and 14B. In other words, for SiC CB diodes 10 having n-type SiC CB layers 14A and 14B, the buried regions 26 are p-type, and for SiC CB diodes 10 having p-type CB layers 14A and 14B, the buried regions 26 are n-type. The buried regions 26 and the SiC CB layers 14 may include any of the features described in co-pending U.S. application Ser. No. 14/752,446, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes.

The SiC CB layers 14A and 14B (e.g., the remainder 28 of the SiC CB layers 14A and 14B) each have a dopant concentration, which may be the same or different, in certain embodiments. Similarly, the dopant concentration in the buried regions 26 of the SiC CB layer 14A and in the buried regions 26 of the SiC CB layer 14B may be the same or different, in certain embodiments. The buried regions 26 and the remainder 30 of the SiC CB layers 14A and 14B are each generally designed to substantially deplete and to generally provide similar amounts (e.g., substantially equal amounts) of effective charge (e.g., per $cm^2$, normalized to device active area) from ionized dopants under reverse bias. The illustrated charge balance structure allows the SiC CB diode 10 to achieve high breakdown voltage and low on-state resistance, since the p-type semiconductor portions and the n-type semiconductor portions are both substantially or completely depleted under nominal blocking conditions.

In terms of dimensions, the SiC CB layers 14A and 14B have thicknesses 30A and 30B, respectively, that may be the same or different. Additionally, the upper SiC epitaxial layer 16 has a thickness 32, which may be the same as or different from the thickness 30A and/or the thickness 30B. Further, each buried region 26 may have a particular thickness 34, a particular width 36, and a particular spacing 38 (e.g., between neighboring buried regions 26). In certain embodiments, the dimensions (e.g., thickness 34, width 36, and/or spacing 38) of the buried regions 26 may be different in different SiC CB layers 14. In different embodiments, the buried regions 26 may have different cross-sectional shapes (e.g., defined by implantation energies/doses).

As illustrated, the thickness 34 of each buried region 26 is less than the thicknesses 30A and 30B of the SiC CB layers 14A and 14B, respectively. That is, the buried regions 26 do not extend through the entire thicknesses 30A and 30B of the SiC CB layers 14A and 14B, respectively. It may be appreciated that this feature is in contrast to other CB diode designs in which the charge-balance regions are continuous (e.g., continuous vertical pillars that extend through the entire thicknesses of the SiC CB layers 14A and 14B). CB diodes including continuous, vertical charge balance pillars are capable of providing low conduction losses and high breakdown voltages. However, fabricating continuous, vertical charge balance pillars that extend through the thicknesses 30A and 30B of the CB layers 14A and 14B may be challenging for certain semiconductor materials having low diffusion coefficients of dopants compared to silicon (Si), such as SiC.

For example, in order to form continuous charge balance pillars, as present in a full charge-balance device, numerous (e.g., 10+) thin epitaxial growth/shallow ion implantation steps may be performed. Alternatively, high energy implantation may be used along with high stopping power masking (e.g., silicon on insulator (SOI), polysilicon, thick silicon oxide, high-Z metals such as platinum, molybdenum, gold), which are not common for current high-volume Si/SiC manufacturing processes. In contrast, the buried regions 26 of the SiC CB diode 10 are amenable to existing and maturing Si/SiC fabrication techniques and infrastructure. For example, present (high volume) ion implantation tooling limits implant acceleration energies to much less than 1 MeV (e.g., approximately 380 keV). At these energies, the projected range (e.g., the penetration depth) of most commonly used SiC dopants (e.g., nitrogen, phosphorus, aluminum) is approximately 1 µm or less, which is suitable for implantation of the buried regions 26, as discussed below with respect to FIGS. 2A-G.

Further, the doping and/or the dimensions of the upper SiC epitaxial layer 16, the SiC CB layers 14, and/or the buried regions 26 may be varied for different embodiments to enable desired electrical performance (e.g., desired blocking voltage and on-resistance) of the SiC CB diode 10. The illustrated SiC CB diode 10 and the CB diode designs discussed below may incorporate different values of the doping of the SiC CB layers 14, the doping of the buried regions 26, the thicknesses 30 of the SiC CB layers 14, the thickness 34 of the buried regions 26, the width 36 of the buried regions 26, and the spacing 38 between the buried regions 26 as discussed in co-pending U.S. application Ser. No. 14/752,446, to achieve a desired breakdown voltage or blocking voltage, as well as a desired reduction in specific on-resistance.

For example, in some embodiments, certain parameters (e.g., the thickness 30 and doping of the SiC CB layers 14 and/or the thickness 32 and doping of the upper SiC epitaxial layer 16) may be selected to provide a breakdown voltage of the SiC CB diode 10 that is between approximately 1 kilovolt (kV) and 10 kV, 1 kV and 5 kV, or any other suitable range. In certain embodiments, the specific on-resistance of the SiC CB layers 14 of the SiC CB diode 10 may between approximately 40% and 50% less than the specific on-resistance of drift layers of a comparable SiC diode without the buried regions 26. Further, in some embodiments, the dopant concentration of the buried regions 26, the upper SiC epitaxial layer 16, and/or the SiC CB layers 14 may be between approximately $5\times10^{15}$ cm$^{-3}$ and approximately $5\times10^{18}$ cm$^{-3}$, approximately $2\times10^{16}$ cm$^{-3}$ and approximately $1\times10^{18}$ cm$^{-3}$, or approximately $5\times10^{16}$ cm$^{-3}$ and approximately $5\times10^{17}$ cm$^{-3}$. Further, in some embodiments, the effective sheet dopant concentration of the buried regions 26, which may be calculated by normalizing the doping concentration of the buried regions 26 to the unit cell area of the SiC CB diode 10, may be less than or equal to approximately $1.1\times10^{13}$ cm$^{-2}$.

Additionally, in some embodiments, the thickness 34 of the buried regions 26 in the SiC CB layers 14 may be less than approximately 10% of the thickness 30 of the respective SiC CB layer 14. For example, the thickness 30 of the SiC CB layers 14 (e.g., the thickness 30A of the first SiC CB layer 14A and/or the thickness 30B of the second SiC CB layer 14B) may be approximately 10 micrometers (µm), and the thickness 34 of the buried regions 26 may be approximately 1 µm. Additionally, in some embodiments, the width 36 of the buried regions 26 may be between approximately 0.4 µm and approximately 5 µm, approximately 0.5 µm and approximately 4 µm, or approximately 0.6 µm and approximately 2 µm. Further, in some embodiments, the spacing 38 between the buried regions 26 may be between approximately 0.25 micrometers (µm) and approximately 10 µm, approximately 0.5 µm and approximately 8 µm, approximately 0.75 µm and approximately 6 µm, or approximately 1 µm and approximately 3 µm.

Figure 2A:
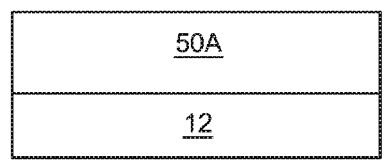
FIGS. 2A-G are schematics illustrating an embodiment of the CB diode of FIG. 1 across several steps of fabrication.
Figure 2B:
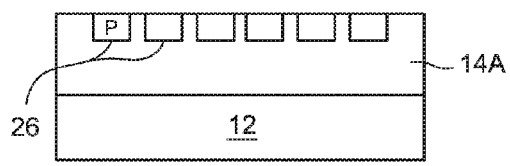
Figure 2C:
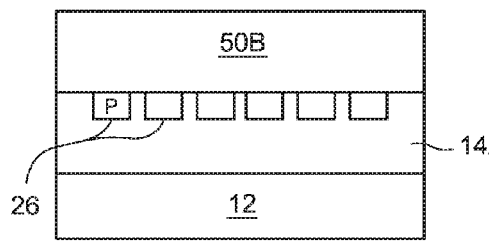
Figure 2D:
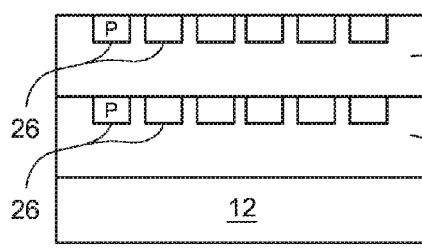

FIGS. 2A-G illustrate cross-sectional views of the SiC CB diode 10 of FIG. 1 at various stages during an example method of fabrication. The example method begins with a first SiC epitaxial layer 50A (e.g., a semiconductor layer) being formed on top of the SiC substrate layer 12 using epitaxial SiC growth techniques to yield the structure illustrated in FIG. 2A. Subsequently, as illustrated in FIG. 2B, the buried regions 26 may be formed in the SiC epitaxial layer 50A using ion implantation to yield the first SiC CB layer 14A. Next, as illustrated in FIG. 2C, a second SiC epitaxial layer 50B may be formed on top of the first SiC CB layer 14B. Subsequently, as illustrated in FIG. 2D, ion implantation may be used to form the buried regions 26 in the second epitaxial layer 50B to yield the second SiC CB layer 14B. It should be understood that the steps illustrated in FIGS. 2C and 2D may be repeated multiple (e.g., 2, 3, 4, 5, or more) times to yield a SiC CB diode including any suitable number of SiC CB layers 14.

Figure 2E:
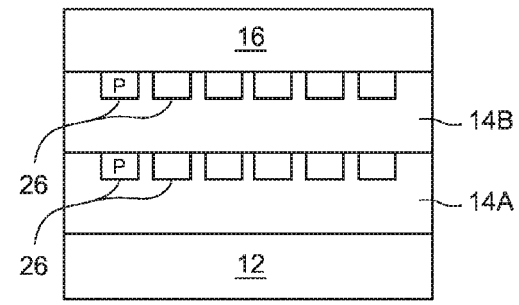
Figure 2F:
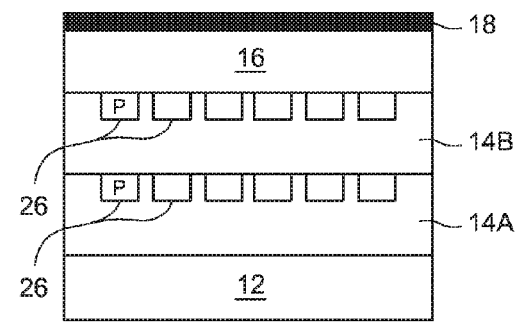
Figure 2G:
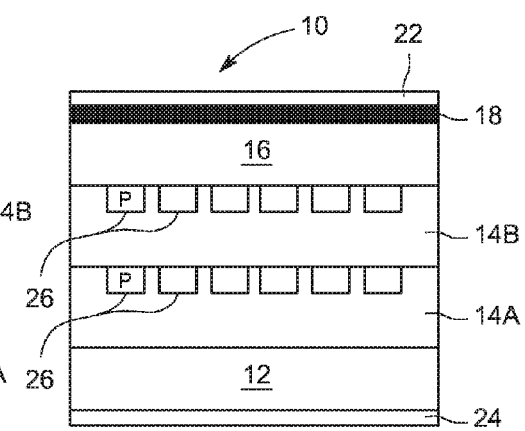

Then, as illustrated in FIG. 2E, the upper SiC epitaxial layer 16 may be formed on top of the uppermost SiC CB layer 14B. After the upper SiC epitaxial layer 16 is completed, the Schottky contact 18 is deposited on top of the upper SiC epitaxial layer 16, as illustrated in FIG. 2F. Subsequently, as illustrated in FIG. 2G, standard device processing steps may be performed (e.g., including forming the top contact 22 and the bottom contact 24 illustrated in FIG. 1), to yield the SiC CB diode 10.

Figure 3:
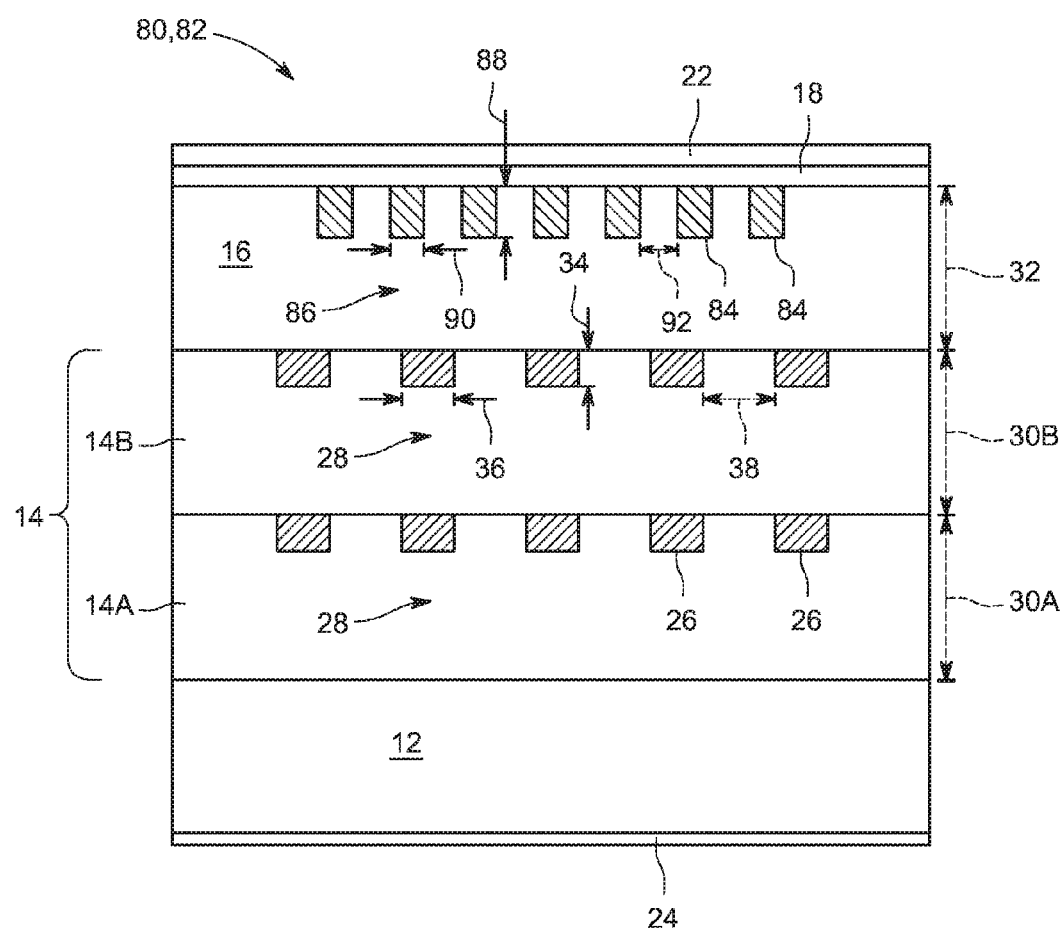
FIG. 3 is a schematic illustrating a cross-sectional view of the active area of a multi-layer CB junction barrier Schottky (JBS) or merged PiN Schottky (MPS) diode having an upper epitaxial layer that includes JBS implanted regions, a Schottky contact formed on the upper epitaxial layer, and CB layers that each include buried regions, in accordance with an embodiment.

As noted above, in some embodiments, the SiC CB diode designs may include features to achieve low leakage current, low conduction losses, low on-resistance, and a high breakdown voltage of the SiC CB diode. For example, FIG. 3 is a schematic illustrating a cross-sectional view of the active area 80 of an embodiment of a SiC CB diode 82 (e.g., a junction barrier Schottky (JBS) diode or a merged PiN Schottky (MPS) diode). As illustrated, the SiC CB diode 82 includes the SiC substrate layer 12, the SiC CB layers 14 (e.g., the first SiC CB layer 14A and/or the second SiC CB layer 14B) each having the plurality of buried regions 26, the upper SiC epitaxial layer 16, the Schottky contact 18, the top contact 22, and the bottom contact 24, as discussed above with respect to FIGS. 1 and 2.

Additionally, to reduce the leakage current and to increase the switching speed, the illustrated SiC CB diode 82 includes a plurality of JBS implanted regions 84 formed in the upper epitaxial layer 16. In particular, the JBS implanted regions 84 are oppositely doped relative to the remainder 86 of the upper epitaxial layer 16. In other words, for SiC CB diodes 82 having n-type upper SiC epitaxial layers 16, the JBS implanted regions 84 are p-type, and for SiC CB diodes 82 having upper SiC epitaxial layers 16 that are p-type, the JBS implanted regions 84 are n-type. Additionally, the JBS implanted regions 84 are disposed adjacent to (e.g., in contact with) the Schottky contact 18. When a reverse bias is applied to the SiC CB diode 82, the JBS implanted regions 84 form extended depletion regions that spread into the areas between JBS implanted regions and pinch off the Schottky barrier. After pinch-off a potential barrier is formed which limits the electric field at the Schottky contact while the drift region supports further increase in voltage in the SiC CB diode 82. These extended depletion regions may shield the Schottky junction (e.g., the interface between the upper epitaxial layer 16 and the Schottky contact 18) from high electric field and reduce the reverse bias leakage current of the SiC CB diode 82 while enabling fast switching at high voltage. However, the JBS implanted regions 84 may increase the on-resistance of the SiC CB diode 82. As discussed below, the dopant concentration, the dimensions, and the positions of the JBS implanted regions 84 may be designed to reduce or minimize the on-resistance of the SiC CB diode 82 for a desired breakdown voltage.

In terms of dimensions, the JBS implanted regions 84 in the upper SiC epitaxial layer 16 each have a particular thickness 88 (e.g., depth), a particular width 90, and a particular spacing 92. In some embodiments, the dimensions (e.g., the thickness 88, the width 90, and/or the spacing 92) of two or more JBS implanted regions 84 may be the same or different. In different embodiments, the JBS implanted regions 84 may have different cross-sectional shapes (e.g., round, rectangular, triangular, or irregular shapes). Further, in some embodiments, the thickness 88, the width 90, the spacing 92, and/or dopant concentration of one or more JBS implanted regions 84 may be the same as or different from the thickness 34, the width 36, the spacing 38, and/or the dopant concentration of one or more buried regions 26.

As illustrated, the thickness 88 of the JBS implanted regions 84 is less than the thickness 32 of the upper SiC epitaxial layer 16. As such, the JBS implanted regions 84 do not extend through the entire upper SiC epitaxial layer 16 and do not contact the buried regions 26 in the second SiC CB layer 14B. In some embodiments, the thickness 88 of the JBS implanted regions 84 may be between approximately 1% and approximately 25%, approximately 2% and approximately 20%, or approximately 5% and approximately 10%, of the thickness 32 of the upper SiC epitaxial layer 16. In certain embodiments, the thickness 32 of the upper SiC epitaxial layer 16 may be between approximately 5 μm and approximately 20 μm or between approximately 5 μm and approximately 15 μm. In some embodiments, the thickness 88 of the JBS implanted regions 84 may be between approximately 0.1 μm and approximately 2 μm, approximately 0.2 μm and 1.5 μm, or approximately 0.5 μm and approximately 1 μm. In some embodiments, the thickness 88 of the JBS implanted regions 84 may be between approximately 0.1 μm and approximately 1 μm. Additionally, in some embodiments, the width 90 of the JBS implanted regions 84 may be between approximately 0.3 μm and approximately 5 μm, approximately 0.4 μm and approximately 4 μm, or approximately 0.5 μm and approximately 3 μm. Further, in some embodiments, the spacing 92 between adjacent JBS implanted regions 84 may be between approximately 1 μm and approximately 20 μm, approximately 1.5 μm and approximately 10 μm, or approximately 2 μm and approximately 5 μm.

Additionally, in some embodiments, the sheet dopant concentration of the JBS implanted regions 84, which may be calculated by normalizing the doping concentration of the JBS implanted regions 84 by unit area of the device, may be between approximately $1 \times 10^{13}$ cm$^{-2}$ and approximately $2 \times 10^{16}$ cm$^{-2}$ or between approximately $1 \times 10^{13}$ cm$^{-2}$ and approximately $1 \times 10^{17}$ cm$^{-2}$. In some embodiments, the dopant concentration of the upper SiC epitaxial layer 16 may be approximately the same as the dopant concentration of the SiC CB layers 14. In some embodiments, each JBS region 84 may have a uniform doping profile. Further, in some embodiments, one or more JBS implanted regions 84 (e.g., each JBS implanted region 84) may have a variable doping profile. For example, one or more JBS implanted regions 84 may have a variable doping profile such that the sheet dopant concentration and/or dose varies along the thickness 88 of the respective JBS implanted region 84. In some embodiments, the doping profile may include a linear function, a step function, a monotonic function, or a normal distribution of sheet doping. In certain embodiments, the doping profile may include two or more regions of constant dopant concentration or two or more peaks of dopant concentration. In certain embodiments, the doping profile may include several implantation doses/energies. In some embodiments, the doping profile may increase (e.g., linearly, gradually, in a step-wise manner, exponentially, with 2, 3, 4, 5, or more peaks, etc.) with increasing distance from the top surface of the upper SiC epitaxial layer 16.

Figure 4A:
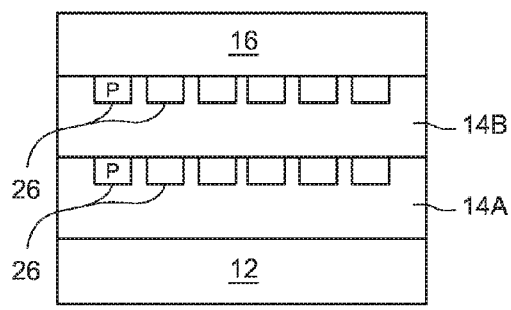
FIGS. 4A-D are schematics illustrating an embodiment of the CB diode of FIG. 3 across several steps of fabrication.
Figure 4B:
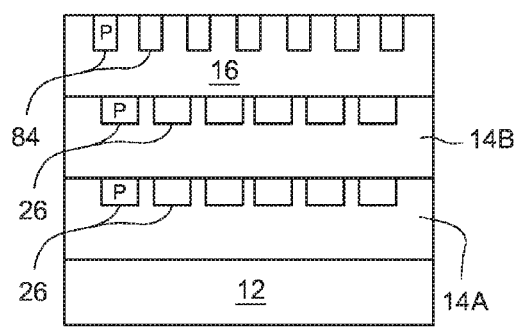
Figure 4C:
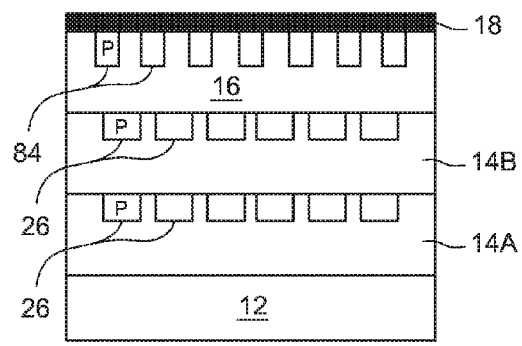
Figure 4D:
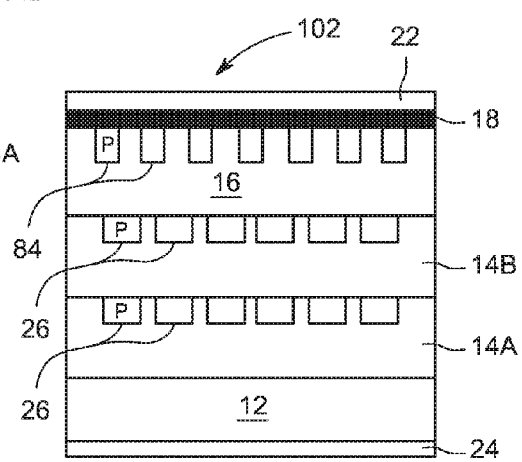

FIGS. 4A-D illustrate cross-sectional views of the SiC CB diode 82 of FIG. 3 at various stages during an example method of fabrication. As illustrated in FIG. 4A, the example method may begin by forming the upper SiC epitaxial layer 16 on top of the uppermost SiC CB layer 14B. It should be appreciated that the structure illustrated in FIG. 4A may be formed by performing the steps illustrated in FIGS. 2A-2E. Subsequently, as illustrated in FIG. 4B, the JBS implanted regions 84 may be formed in the upper SiC epitaxial layer 16 using ion implantation. Next, as illustrated in FIG. 4C, the Schottky contact 18 is deposited on top of the upper SiC epitaxial layer 16 having the JBS implanted regions 84. Subsequently, as illustrated in FIG. 2D, standard device processing steps may be performed (e.g., including forming the top contact 22 and the bottom contact 24 illustrated in FIG. 3), to yield the SiC CB diode 82.

Figure 5:
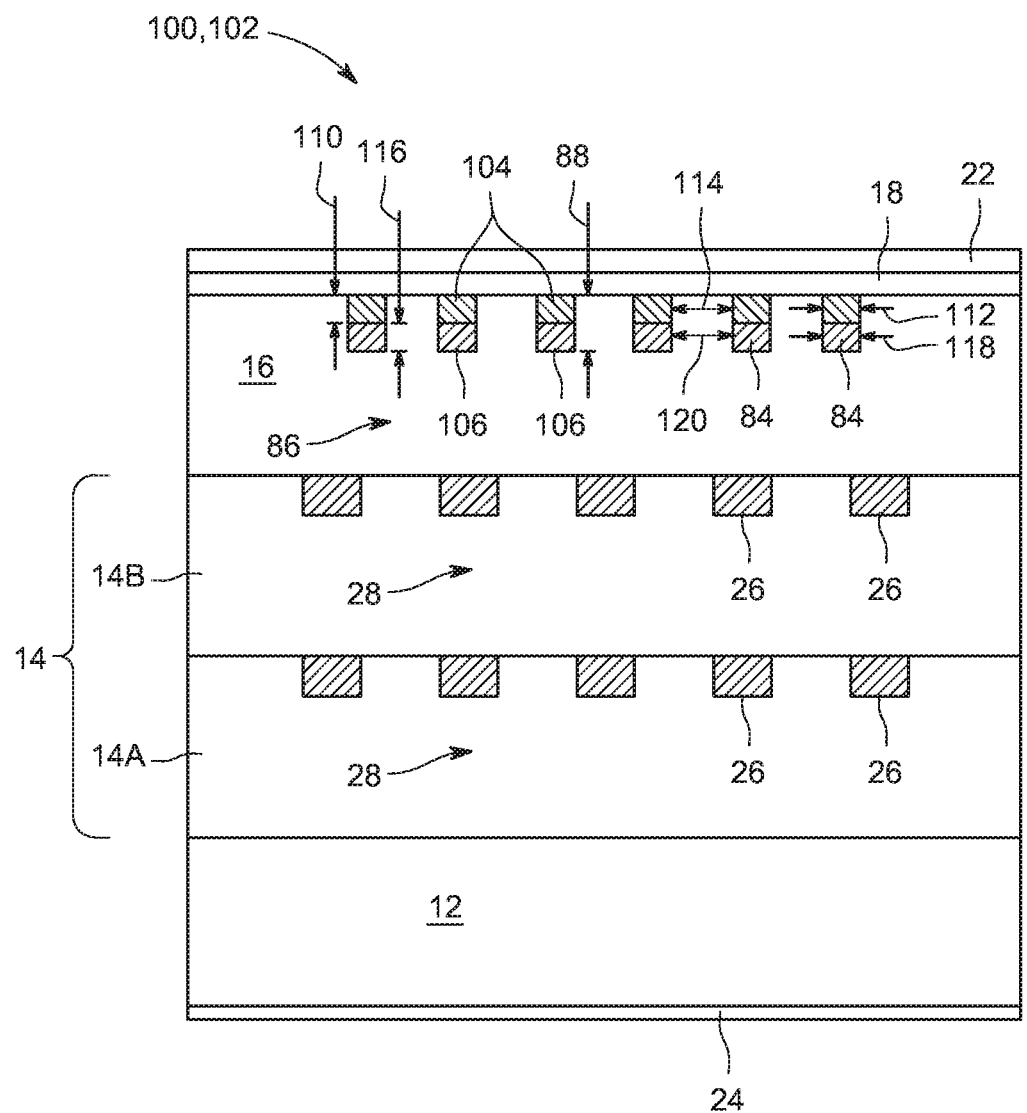
FIG. 5 is a schematic illustrating a cross-sectional view of the active area of a multi-layer CB diode having an upper epitaxial layer that includes JBS implanted regions, a Schottky contact formed on the upper epitaxial layer, and CB layers that each include buried regions, wherein the doping concentration of each JBS implanted region varies over the depth of the respective implanted region, in accordance with an embodiment.

FIG. 5 is a schematic illustrating a cross-sectional view of the active area 100 of an embodiment of a SiC CB diode 102 (e.g., a junction barrier Schottky (JBS) diode or a merged PiN Schottky (MPS) diode). As illustrated, the SiC CB diode 102 includes the SiC substrate layer 12, the SiC CB layers 14 (each having the plurality of buried regions 26), the upper SiC epitaxial layer 16 (having the JBS implanted regions 84), the Schottky contact 18, the top contact 22, and the bottom contact 24, as discussed above with respect to FIG.

3. As noted above, in some embodiments, each JBS implanted region 84 includes a variable doping profile such that the dopant concentration or dose of each JBS implanted region 84 increases (e.g., linearly, gradually, in a step-wise manner, exponentially, with 2, 3, 4, 5, or more peaks or constant doping regions, etc.) with increasing distance from the top surface of the upper SiC epitaxial layer 16. In the illustrated embodiment, each JBS implanted region 84 includes a first doped region 104 having a first dopant concentration, and a second doped region 106 having a second dopant concentration that is different from the first dopant concentration. As illustrated, the first doped region 104 of each JBS implanted region 84 is disposed closer to the Schottky contact 18 and farther from the SiC CB layers 14 than the second doped region 106 of the respective JBS implanted region 84. In some embodiments, the first doped region 104 of each JBS implanted region 84 is disposed adjacent to (e.g., in contact with) the Schottky contact 18 and adjacent to (e.g., in contact with) and on top of the second doped region 106 of the respective JBS implanted region 84. In other words, the first doped region 104 is disposed between the Schottky contact 18 and the second doped region 106. In some embodiments, to implant the first and second doped regions 104 and 106 such that the first doped region 104 is on top of the second doped region 106, the second doped region 106 may be implanted with a first implantation energy, and the first doped region 104 may be implanted into with a second implantation energy that is less than the first implantation energy. It should be appreciated that while the first and second doped regions 104 and 106 may be referred to as "adjacent to" or "in contact with" one another, a dopant concentration gradient may be present between the first and second doped regions 104 and 106. Further, it should be appreciated that each JBS implanted region 84 may include any suitable number of differently doped regions, such as 3, 4, 5, or more.

In certain embodiments, to reduce the on-resistance of the SiC CB diode 102 while maintaining a low electric field proximate to the Schottky contact 18, the dopant concentration of each first doped region 104 may be less than the dopant concentration of each second doped region 106. For example, the first doped region 104 may be implanted into the upper SiC epitaxial layer 16 with a first implantation dose, and the second doped region 106 may be implanted into the upper SiC epitaxial layer 16 with a second implantation dose that is greater than the first implantation dose. In some embodiments, the first implantation dose may be between approximately $1 \times 10^{17}$ cm$^{-3}$ and approximately $1 \times 10^{19}$ cm$^{-3}$, and the second implantation dose may be between approximately $1 \times 10^{18}$ cm$^{-3}$ and approximately $1 \times 10^{20}$ cm$^{-3}$. In some embodiments, the dopant concentration of each second doped region 106 may be at least approximately 2, 5, 10, 25, 50, 75, 100, or 200 times greater than the dopant concentration of each first doped region 104. In certain embodiments, the dopant concentration of each second doped region 106 may be between approximately 10 and 100 times the dopant concentration of each first doped region 104.

In terms of dimensions, the first doped regions 104 each have a particular thickness 110 (e.g., depth), a particular width 112, and a particular spacing 114. In some embodiments, the dimensions (e.g., the thickness 110, the width 112, and/or the spacing 114) of two or more first doped regions 104 may be the same or different. Further, the second doped regions 106 each have a particular thickness 116 (e.g., depth), a particular width 118, and a particular spacing 120. In some embodiments, the dimensions (e.g., the thickness 116, the width 118, and/or the spacing 120) of two or more second doped regions 106 may be the same or different. Further, in certain embodiments, the thickness 110, the width 112, and/or the spacing 114 of the first doped regions 104 may be the same as or different from the thickness 116, the width 118, and/or the spacing 120, respectively, of the second doped regions 106.

Additionally, in some embodiments, the width 112 of the first doped regions 104 and/or the width 118 of the second doped regions 106 may be between approximately 0.5 μm and approximately 5 μm or between approximately 1 μm and approximately 3 μm. Further, in some embodiments, the spacing 114 of the first doped regions 104 and/or the spacing 120 of the second doped regions 106 may be between approximately 1 μm and approximately 20 μm, approximately 1.5 μm and approximately 10 μm, or approximately 2 μm and approximately 5 μm. For the illustrated embodiment, the sum of the thickness 110 of the first doped region 104 and the thickness 116 of the second doped region 106 is approximately equal to the thickness 88 of the JBS implanted region 84. In certain embodiments, the thickness 110 of the first doped regions 104 and/or the thickness 116 of the second doped regions 106 may be between approximately 90% and approximately 10%, between approximately 20% and approximately 80%, between approximately 30% and approximately 70%, or between approximately 40% and approximately 60% of the thickness 88 of the JBS implanted regions 84. Further, in some embodiments, the thickness 110 of the first doped regions 104 and/or the thickness 116 of the second doped regions 106 may be between approximately 0.1 μm and approximately 5 μm, approximately 0.2 μm and approximately 4 μm, or approximately 0.3 μm and approximately 2 μm.

Figure 6:
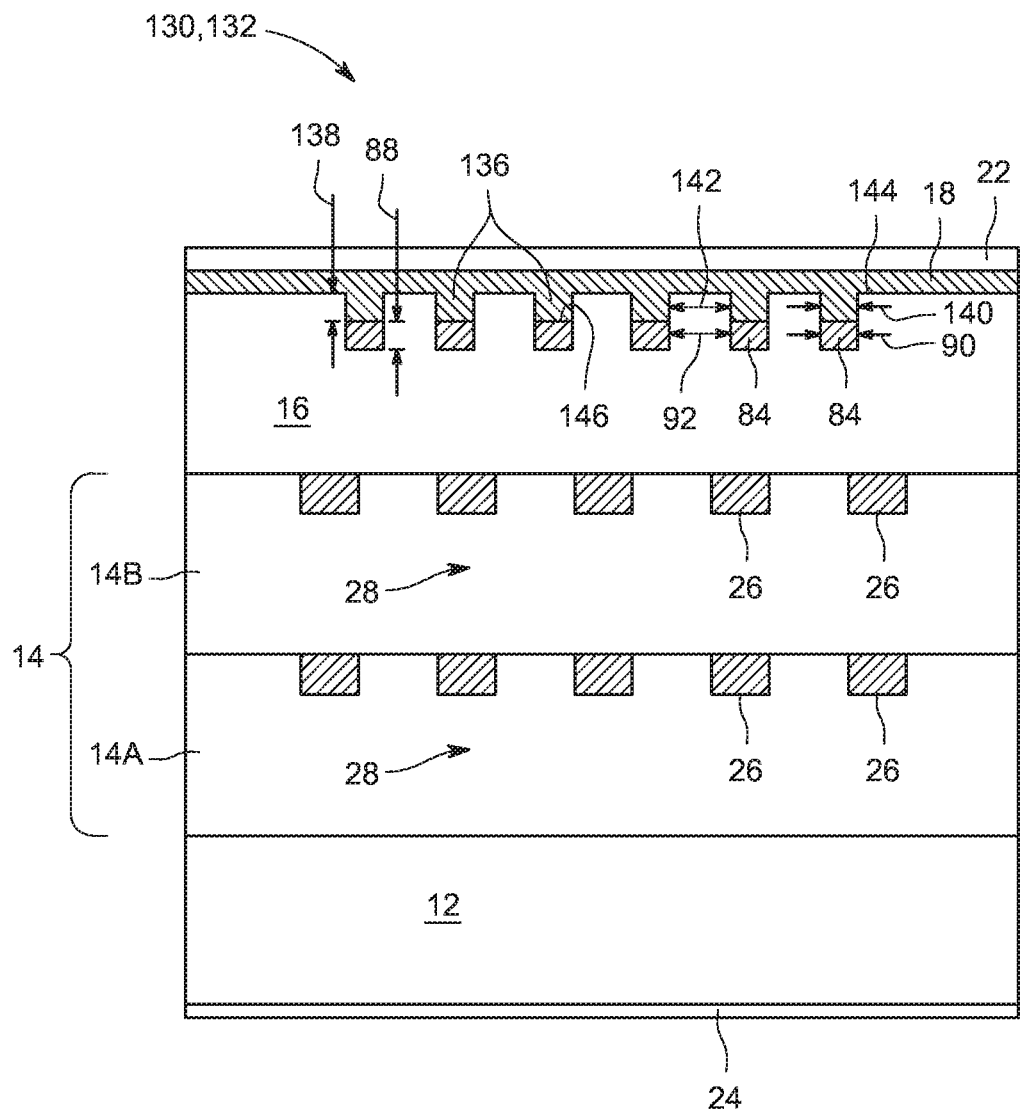
FIG. 6 is a schematic illustrating a cross-sectional view of the active area of a multi-layer CB diode having an upper epitaxial layer that includes JBS implanted regions, a Schottky contact formed on the upper epitaxial layer, and CB layers that each include buried regions, wherein the Schottky contact extends into trenches etched in the upper epitaxial layer, in accordance with an embodiment.

FIG. 6 is a schematic illustrating a cross-sectional view of the active area 130 of an embodiment of a SiC CB diode 132 (e.g., a junction barrier Schottky (JBS) diode or a merged PiN Schottky (MPS) diode). As illustrated, the SiC CB diode 102 includes the SiC substrate layer 12, the SiC CB layers 14 (each having the plurality of buried regions 26), the upper SiC epitaxial layer 16 (having the JBS implanted regions 84), the Schottky contact 18, the top contact 22, and the bottom contact 24, as discussed above with respect to FIG. 3. Further, in the embodiment illustrated in FIG. 6, the Schottky contact 18 extends into (e.g., fills) a plurality of trenches 136 etched into the upper SiC epitaxial layer 16. In some embodiments, to reduce the maximum electric field at the Schottky interface of the SiC CB diode 132 in reverse mode for a limited increase in on-state resistance, one or more of the trenches 136 (e.g., filled with the material of the Schottky contact 18) may be disposed adjacent to (e.g., in contact with) and above one or more of the JBS implanted regions 84. For example, in some embodiments, each trench 136 may be disposed adjacent to and above a JBS implanted region 84. In certain embodiments, each JBS implanted region 84 may be disposed adjacent to and below a trench 136.

In terms of dimensions, the trenches 136 may each have a particular depth 138, a particular width 140, and a particular spacing 142. The dimensions (e.g., the depth 138, the width 140, and/or the spacing 142) of two or more trenches 136 may be the same or different. Further, the depth 138, the width 140, and/or the spacing 142 of one or more trenches 136 that are each disposed adjacent to (e.g., in contact with) a JBS implanted region 84 may be the same as or different from the thickness 88, the width 90, and/or the spacing 92 of the respective JBS implanted region 84. For example, in some embodiments, the width 140 of one or more trenches 136 that are each disposed adjacent to a JBS implanted region 84 may be the same as the width 90 of the respective JBS implanted region 84. In such embodiments, the one or more trenches 136 may extend from a top surface 144 of the upper SiC epitaxial layer 16 to a top surface 146 of the respective JBS implanted region 84. In other words, the top surface 146 of the JBS implanted regions 84 may be spaced apart from the top surface 144 of the upper SiC epitaxial layer 16 by the thickness 138 of the respective trenches 136 such that the JBS implanted regions 84 are not in contact with the top surface 144 of the upper SiC epitaxial layer 16.

In some embodiments, the width 140 of the trenches 136 may be between approximately 0.3 µm and approximately 5 µm, approximately 0.4 µm and approximately 4 µm, or approximately 0.5 µm and approximately 3 µm. Additionally, in some embodiments, the spacing 142 of the trenches 136 may be between approximately 1 µm and approximately 20 µm, approximately 1.5 µm and approximately 10 µm, or approximately 2 µm and approximately 5 µm. Further, in some embodiments, the depth 138 of the trenches 136 may be between approximately 0.1 µm and approximately 5 µm, approximately 0.2 µm and approximately 4 µm, or approximately 0.3 µm and approximately 2 µm. In certain embodiments, the thickness 88 of the JBS implanted regions 84 of the SiC CB diode 132 may be less than the thickness 88 of the JBS implanted regions 84 of the SiC CB diodes that do not have the trenches 136 (e.g., the SiC CB diode 82). For example, in some embodiments, the thickness 88 of the JBS implanted regions 84 of the SiC CB diode 132 may be between approximately 0.1 µm and approximately 5 µm, approximately 0.2 µm and approximately 4 µm, or approximately 0.3 µm and approximately 2 µm.

Figure 7A:
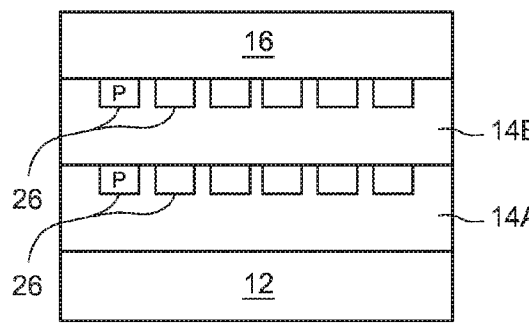
FIGS. 7A-E are schematics illustrating an embodiment of the CB diode of FIG. 6 across several steps of fabrication.
Figure 7B:
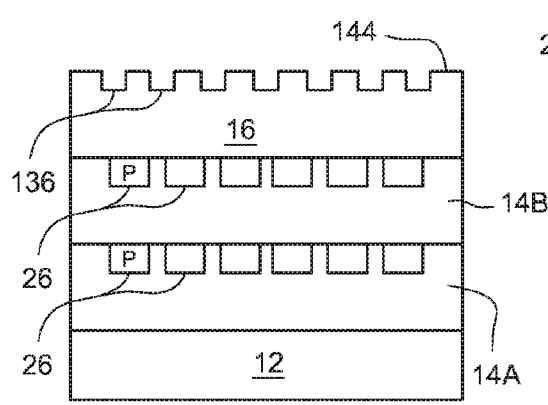
Figure 7C:
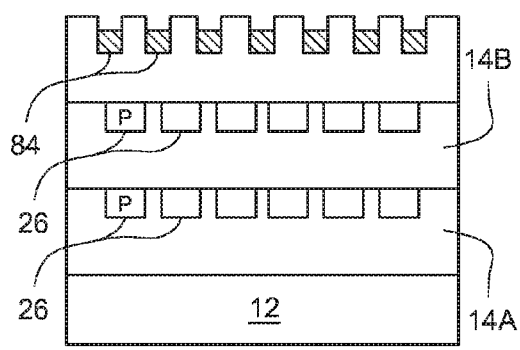

FIGS. 7A-E illustrate cross-sectional views of the SiC CB diode 132 of FIG. 6 at various stages during an example method of fabrication. As illustrated in FIG. 7A, the example method may begin by forming the upper SiC epitaxial layer 16 on top of the uppermost SiC CB layer 14B. It should be appreciated that the structure illustrated in FIG. 7A may be formed by performing the steps illustrated in FIGS. 2A-2E. Subsequently, as illustrated in FIG. 7B, the trenches 136 may be formed in the upper SiC epitaxial layer 16 by etching into (e.g., removing portions of) the top surface 144 of the upper SiC epitaxial layer 16. Next, as illustrated in FIG. 7C, the JBS implanted regions 84 may be formed in the upper SiC epitaxial layer 16 using ion implantation. As illustrated, in some embodiments, each JBS implanted region 84 may be formed directly below a trench 136. In certain embodiments, the JBS implanted regions 84 may be formed in the upper SiC epitaxial layer 16 before the trenches 136 are formed. For example, in some embodiments, the trenches 136 may be etched into the JBS implanted regions 84.

Figure 7D:
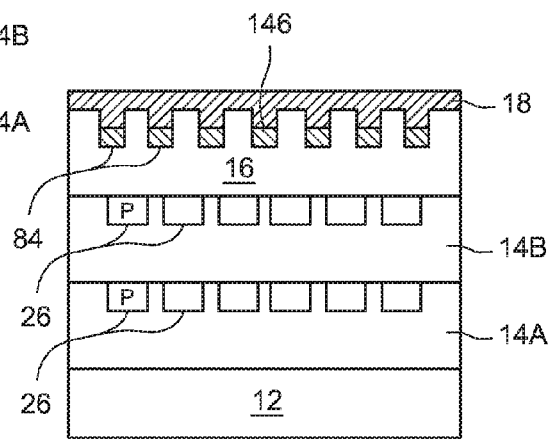
Figure 7E:
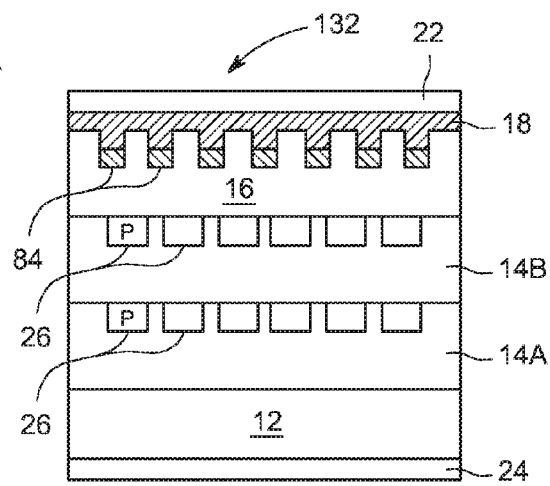

Next, as illustrated in FIG. 7D, the Schottky contact 18 is deposited on the top surface 144 of the upper SiC epitaxial layer 16 and into the trenches 136. In particular, the Schottky contact 18 fills the trenches 136. Further, as illustrated, the portions of the Schottky contact 18 in the trenches 136 may contact the top surface 146 of the JBS implanted regions 84. Subsequently, as illustrated in FIG. 7E, standard device processing steps may be performed (e.g., including forming the top contact 22 and the bottom contact 24 illustrated in FIG. 7), to yield the SiC CB diode 132.

Figure 8:
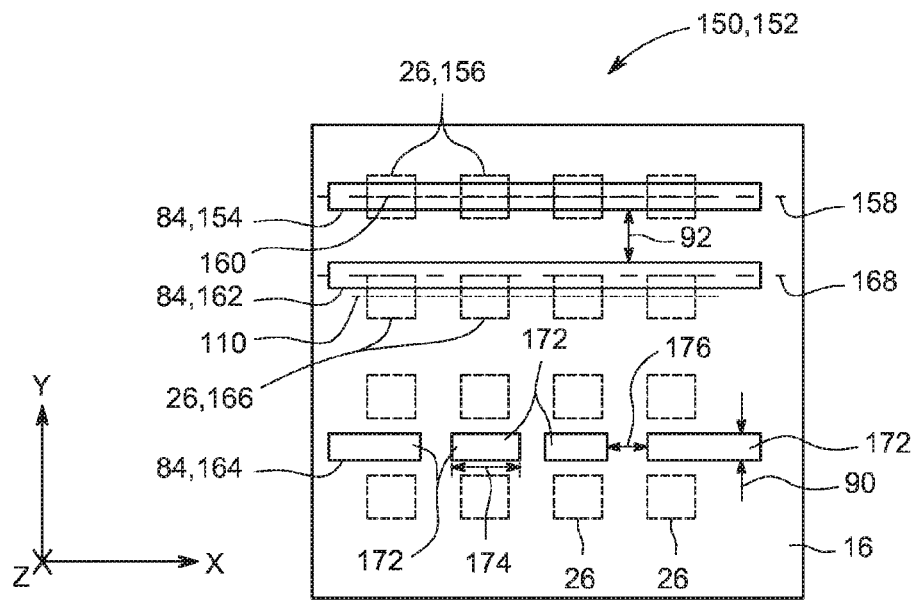
FIG. 8 is a schematic of a top down view of the active area of a CB diode including buried regions and JBS implanted regions having different alignments, in accordance with an embodiment.

The JBS implanted regions 84 may have any suitable alignment or orientation with respect to the buried regions 26 in the CB layers 14. For example, FIG. 8 illustrates a top down view of an embodiment of an active area 150 of a SiC CB diode 152 including a plurality of JBS implanted regions 84 and a plurality of buried regions 26. The JBS implanted regions 84 are illustrated by solid lines and the buried regions 26 are illustrated by dashed lines in FIG. 8, because the buried regions 26 are disposed below the JBS implanted regions 84 in the underlying CB layers 14. It should be appreciated that one or more of the JBS implanted regions 84 and/or the trenches 136 may be aligned or misaligned with respect to the underlying buried regions 26. For example, one or more JBS implanted regions 84 may be oriented parallel, perpendicular, or at an angle (e.g., between 0 and 90 degrees) with respect to one or more buried regions 26. Further, one or more JBS implanted regions 84 may encompass (e.g., overlay) the entirety of one or more buried regions 26, a portion of one or more buried regions 26, or none of the buried regions 26.

In the illustrated embodiment, the SiC CB diode 152 includes a first JBS implanted region 154 that is aligned with one or more first buried regions 156 of the plurality of buried regions 26. As illustrated, an axis 158 (e.g., extending horizontally or along the x-axis) of the first JBS implanted region 154 may be parallel with an axis 160 (e.g., extending horizontally or along the x-axis) of the one or more first buried regions 156. Additionally, the first JBS implanted region 154 encompasses (e.g., overlays or overlaps with in the top-down view) portions of the one or more first buried regions 156. Further, in the illustrated embodiment, the SiC CB diode 152 includes second and third JBS implanted regions 162 and 164 that are misaligned with respect to the plurality of buried regions 26. As illustrated, the second JBS implanted region 162 partially encompasses (e.g., overlays or overlaps with in the top-down view) one or more second buried regions 166 of the plurality of buried regions 26. Further, an axis 168 (e.g., extending horizontally or along the x-axis) of the second JBS implanted region 162 may be parallel with and offset from (e.g., by a range of approximately 0.1 µm to approximately 10 µm) an axis 170 (e.g., extending horizontally or along the x-axis) of the one or more second buried regions 166. In some embodiments, as illustrated, the third JBS implanted region 164 may not encompass (e.g., overlay or overlap with in the top-down view) any buried regions 26 of the plurality of buried regions 26. It should be appreciated that the first, second, and third JBS implanted regions 154, 162, and 164 are examples of possible arrangements of the plurality of JBS implanted regions 84 and may not be combined as shown in FIG. 8 in certain embodiments.

Additionally, the JBS implanted regions 84 may be continuous (e.g., horizontally continuous) and/or discontinuous (e.g., horizontally discontinuous or segmented). For example, as illustrated, the first and second JBS implanted regions 154 and 162 may be continuous (e.g., continuous along the x-axis), and the third JBS implanted region 164 may be discontinuous (discontinuous along x-axis or segmented along the x-axis). In particular, the third JBS implanted region 164 may include a plurality of implanted segments 172 (e.g., JBS segments or JBS implanted segments). The implanted segments 172 may each have a particular length 174 and a particular spacing 176. In some embodiments, the length 174 and/or the spacing 176 of two or more implanted segments 172 may be the same or different. The spacing 176 between the implanted segments 172 of the third JBS implanted region 164 may increase conduction Schottky area of the active area 150 and the current rating of the SiC CB diode 152 as compared to SiC CB diodes that do not include segmented implanted regions. In certain embodiments, the spacing 176 of the implanted segments 172 may be between approximately 1 µm and approximately 5 µm.

Figure 9:
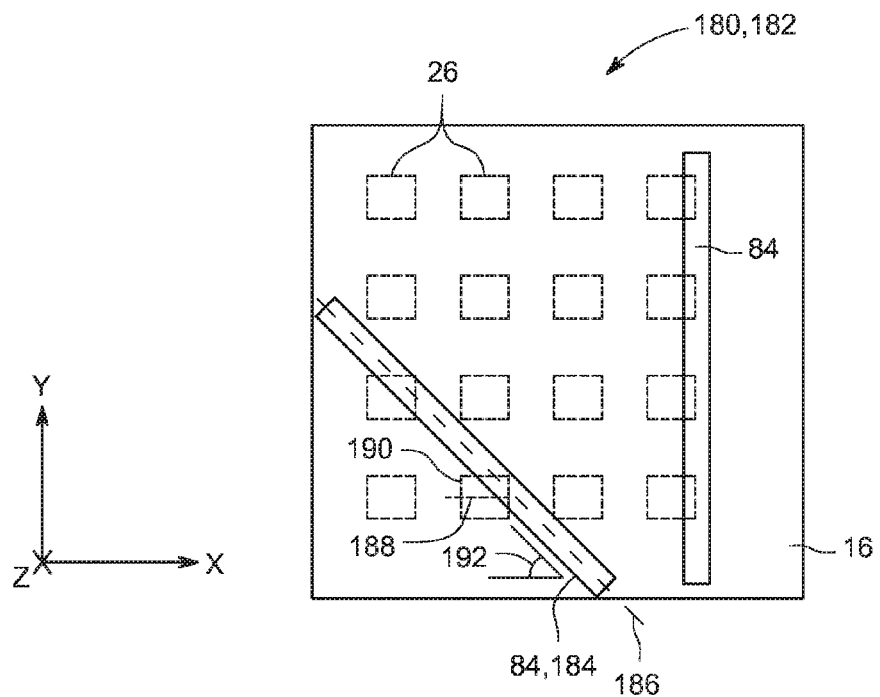
FIG. 9 is a schematic of a top down view of the active area of a CB diode including buried regions and JBS implanted regions having different alignments, in accordance with an embodiment.

In some embodiments, one or more JBS implanted regions 84 may be angled with respect to the one or more buried regions 26. For example, FIG. 9 illustrates a top down view of an embodiment of an active area 180 of a SiC CB diode 182 including a plurality of JBS implanted regions 84 and a plurality of buried regions 26. The buried regions 26 are illustrated by dashed lines in FIG. 9 because the buried regions 26 are disposed in the underlying CB layers 14. In particular, in the illustrated embodiment, the SiC CB diode 182 includes a first JBS implanted region 184 that is angled with respect to the plurality of buried regions 26. That is, an axis 186 (e.g., extending horizontally or along the x-axis and the y-axis) of the JBS implanted region 184 is not parallel with an axis 188 (e.g., extending horizontally or along the x-axis) of one or more first buried regions 190. As illustrated, the axis 186 is offset from the axis 188 by an angle 192. In certain embodiments, the angle 192 may be between approximately 1 degree and approximately 89 degrees, approximately 20 degrees and 60 degrees, approximately 30 degrees and approximately 50 degrees, or any other suitable range.

Technical effects of the invention include CB diode designs that reduce switching losses and leakage current and increase switching speed of CB diodes, without substantially increasing on-resistance or diminishing breakdown voltage. In particular, the disclosed CB diodes include CB layers having buried regions of n-type or p-typed doping that reshape the electrical field in the active area of a CB diode to enable low conduction losses and high breakdown voltages while still maintaining a relatively simple fabrication process. Additionally, in certain embodiments, the disclosed CB diodes include JBS implanted regions of n-type or p-type doping that are in contact with a Schottky contact disposed on the upper epitaxial layer of the CB diode. The JBS implanted regions reshape the electric field in the upper epitaxial layer of the CB diode to enable reduced leakage current and high switching speeds without significantly increasing the on-resistance or diminishing the breakdown voltage of the CB diode. As a result, the disclosed CB diodes enable increased switching speeds and reduced switching losses and leakage current compared to existing diodes having the same current/voltage rating.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A charge-balanced (CB) diode, comprising:
   an active area comprising:
   one or more charge-balanced (CB) layers, wherein each CB layer comprises:
   an epitaxial layer having a first conductivity type; and
   a plurality of buried regions having a second conductivity type implanted in the epitaxial layer, wherein the plurality of buried regions and the epitaxial layer are both configured to substantially deplete to provide substantially equal amounts of charge from ionized dopants when a reverse bias is applied to the CB diode; and
   an upper epitaxial layer having the first conductivity type, wherein the upper epitaxial layer is disposed adjacent to an uppermost CB layer of the one or more CB layers, and wherein the upper epitaxial layer comprises a plurality of junction barrier Schottky (JBS) implanted regions having the second conductivity type; and
   a Schottky contact disposed adjacent to the upper epitaxial layer to form a Schottky junction, wherein the Schottky contact is formed from a metal or polysilicon, and wherein the Schottky contact is disposed adjacent to the plurality of JBS implanted regions.

2. The CB diode of claim 1, wherein the Schottky contact is formed from titanium or nickel.

3. The CB diode of claim 1, wherein the Schottky contact is formed from polysilicon having the first conductivity type.

4. The CB diode of claim 1, wherein the CB diode comprises a junction barrier Schottky (JBS) diode or a merged PiN Schottky (MPS) diode.

5. The CB diode of claim 1, wherein a sheet doping concentration of the plurality of JBS implanted regions is between approximately $1 \times 10^{13}$ cm$^{-2}$ and approximately $2 \times 10^{16}$ cm$^{-2}$.

6. The CB diode of claim 1, wherein a spacing between adjacent JBS implanted regions is between approximately 1 μm and approximately 10 μm.

7. The CB diode of claim 6, wherein the spacing is between approximately 2 μm and approximately 5 μm.

8. The CB diode of claim 1, wherein at least one JBS implanted region of the plurality of JBS implanted regions is not aligned with the plurality of buried regions.

9. The CB diode of claim 1, wherein at least one JBS implanted region of the plurality of JBS implanted regions has a first shape and at least one buried region of the plurality of buried regions has a second shape different from the first shape.

10. The CB diode of claim 1, wherein an axis of at least one JBS implanted region of the plurality of JBS implanted regions is not parallel to an axis of at least one buried region of the plurality of buried regions.

11. The CB diode of claim 1, wherein each JBS implanted region of the plurality of JBS implanted regions comprises a variable doping profile.

12. The CB diode of claim 11, wherein the variable doping profile comprises a linear function, a step-wise function, a monotonic function, or a normal distribution of sheet doping.

13. The CB diode of claim 1, wherein the upper epitaxial layer comprises a plurality of trenches, wherein each trench of the plurality of trenches extends from a top surface of the upper epitaxial layer to a top surface of a JBS implanted region of the plurality of JBS implanted regions, and wherein the Schottky contact extends into the plurality of trenches and is disposed adjacent to the top surface of each JBS implanted region of the plurality of JBS implanted regions.

14. The CB diode of claim 13, wherein a depth of at least one trench of the plurality of trenches is between approximately 0.1 μm and approximately 5 μm.

15. The CB diode of claim 13, wherein at least trench of the plurality of trenches is not aligned with the plurality of buried regions.

16. A charge-balanced (CB) diode, comprising:
one or more charge-balanced (CB) layers, wherein each CB layer comprises:
an epitaxial layer having a first conductivity type; and
a plurality of buried regions having a second conductivity type implanted in the epitaxial layer, wherein a thickness of each buried region of the plurality of buried regions is less than a thickness of the epitaxial layer;
an upper epitaxial layer having the first conductivity type and disposed on top of the one or more CB layers, wherein the upper epitaxial layer comprises a plurality of junction barrier Schottky (JBS) implanted regions having the second conductivity type, and wherein a thickness of each JBS implanted region of the plurality of JBS implanted regions is less than a thickness of the upper epitaxial layer; and
a Schottky contact disposed on top of the upper epitaxial layer, wherein the Schottky contact is disposed adjacent to the plurality of JBS implanted regions.

17. The CB diode of claim 16, wherein the Schottky contact is formed from titanium, nickel, or polysilicon having the first conductivity type.

18. The CB diode of claim 16, wherein an effective sheet doping concentration of the plurality of buried regions is less than or equal to $1.1\times10^{13}$ cm', and wherein a sheet doping concentration of the plurality of JBS implanted regions is between approximately $1\times10^{13}$ cm$^{-2}$ and approximately $2\times10^{16}$ cm$^{-2}$.

19. The CB diode of claim 16, wherein a spacing between adjacent JBS implanted regions of the plurality of implanted regions is between approximately 1 μm and approximately 5 μm.

20. The CB diode of claim 16, wherein each JBS implanted region of the plurality of implanted regions comprises a variable doping profile such that a dopant concentration of each JBS implanted region increases into a depth of the respective JBS implanted region.

21. The CB diode of claim 16, wherein the upper epitaxial layer comprises a plurality of trenches formed in a top surface of the upper epitaxial layer, wherein the Schottky contact is disposed adjacent to the top surface of the upper epitaxial layer and extends into each trench of the plurality of trenches to contact a top surface of each JBS implanted region of the plurality of implanted regions, and wherein a depth of at least one trench of the plurality of trenches is between approximately 0.3 μm and approximately 2 μm.

* * * * *